United States Patent
Eppich et al.

(10) Patent No.: US 8,125,292 B2
(45) Date of Patent: Feb. 28, 2012

(54) COAXIAL LINE TO PLANAR RF TRANSMISSION LINE TRANSITION USING A MICROSTRIP PORTION OF GREATER WIDTH THAN THE RF TRANSMISSION LINE

(75) Inventors: Raymond D. Eppich, Plano, TX (US); James M. Irion, II, Allen, TX (US)

(73) Assignee: Raytheon Company, Waltham, MA (US)

( * ) Notice: Subject to any disclaimer, the term of this patent is extended or adjusted under 35 U.S.C. 154(b) by 294 days.

(21) Appl. No.: 12/253,008

(22) Filed: Oct. 16, 2008

(65) Prior Publication Data

US 2010/0097158 A1  Apr. 22, 2010

(51) Int. Cl.
*H01P 5/02* (2006.01)
(52) U.S. Cl. .......................................... 333/33; 333/260
(58) Field of Classification Search .................... 333/33, 333/246, 260
See application file for complete search history.

(56) References Cited

U.S. PATENT DOCUMENTS

| | | | |
|---|---|---|---|
| 4,837,529 A * | 6/1989 | Gawronski et al. | 333/33 |
| 5,618,205 A * | 4/1997 | Riddle et al. | 439/581 |
| 5,886,590 A * | 3/1999 | Quan et al. | 333/33 |
| 6,400,234 B1 * | 6/2002 | Ohhashi et al. | 333/33 |

FOREIGN PATENT DOCUMENTS

| | | |
|---|---|---|
| EP | 0 901 181 A | 3/1999 |
| GB | 1 131 115 A | 10/1968 |
| JP | 54 159846 A | 12/1979 |
| JP | 55 086204 A | 6/1980 |
| JP | 60 182801 A | 9/1985 |

* cited by examiner

OTHER PUBLICATIONS

PCT Notification of Transmittal of The Intl. Search Report and the Written Opinion of the Intl. Searching Authority, or the Declaration mailed Jan. 26, 2010 regarding PCT/US2009/058911 filed Sep. 30, 2009.

*Primary Examiner* — Benny Lee
(74) *Attorney, Agent, or Firm* — Christie, Parker & Hale, LLP

(57) ABSTRACT

A coaxial transition includes a first conductor aligned along a first axis. The transition also includes a ground shield surrounding the first conductor such that a first gap exists between the first conductor and the ground shield. An electric field radiates between the first conductor and the ground shield through the first gap. The transition further includes a second conductor aligned along a second axis and coupled to the first conductor. The second conductor forms a second gap between the second conductor and a portion of the ground shield. A first portion of the electric field radiates between the second conductor and the ground shield through the second gap. The transition also includes a top ground plane aligned substantially parallel to the second conductor. A third gap exists between the top ground plane and the second conductor. The second gap and the third gap are substantially parallel with the second conductor therebetween.

20 Claims, 2 Drawing Sheets

COAXIAL LINE TO PLANAR RF TRANSMISSION LINE TRANSITION USING A MICROSTRIP PORTION OF GREATER WIDTH THAN THE RF TRANSMISSION LINE

TECHNICAL FIELD OF THE INVENTION

This invention relates in general to radio frequency transmission, and in particular to a radio frequency coaxial transition.

BACKGROUND

The transition between a vertical and horizontal radio frequency ("RF") propagation path within circuit boards has proven to be inefficient. Such transitions are typically mismatched and include inductive discontinuities in the circuit path and have relatively high insertion loss and poor return loss. Previous attempts have included capacitance compensation on the center conductor of the vertical coaxial structure, processing smaller external vertical coaxial features, or using smaller size external surface mount coaxial parts to reduce the inductive parasitic.

SUMMARY

The teachings of the present disclosure relate to a coaxial transition that includes a first conductor aligned along a first axis. The transition also includes a ground shield surrounding the first conductor such that a first gap exists between the first conductor and the ground shield. An electric field radiates between the first conductor and the ground shield through the first gap. The transition further includes a second conductor aligned along a second axis and coupled to the first conductor. The second conductor forms a second gap between the second conductor and a portion of the ground shield. A first portion of the electric field radiates between the second conductor and the ground shield through the second gap. The transition also includes a top ground plane aligned substantially parallel to the second conductor. A third gap exists between the top ground plane and the second conductor. The second gap and the third gap are substantially parallel with the second conductor therebetween.

Technical advantages of particular embodiments include a coaxial transition that has little or no inductive break therein. Accordingly, a coaxial transmission line may transition (e.g., change directions from horizontal to vertical) more efficiently than a traditional coaxial transition. This may reduce insertion loss and obtain an improved return loss compared to a similarly sized traditional coaxial transition.

Other technical advantages will be readily apparent to one of ordinary skill in the art from the following figures, descriptions, and claims. Moreover, while specific advantages have been enumerated above, various embodiments may include all, some, or none of the enumerated advantages.

BRIEF DESCRIPTION OF THE DRAWINGS

A more complete understanding of particular embodiments will be apparent from the detailed description taken in conjunction with the accompanying drawings in which.

DETAILED DESCRIPTION OF THE DRAWINGS

Figure 1:
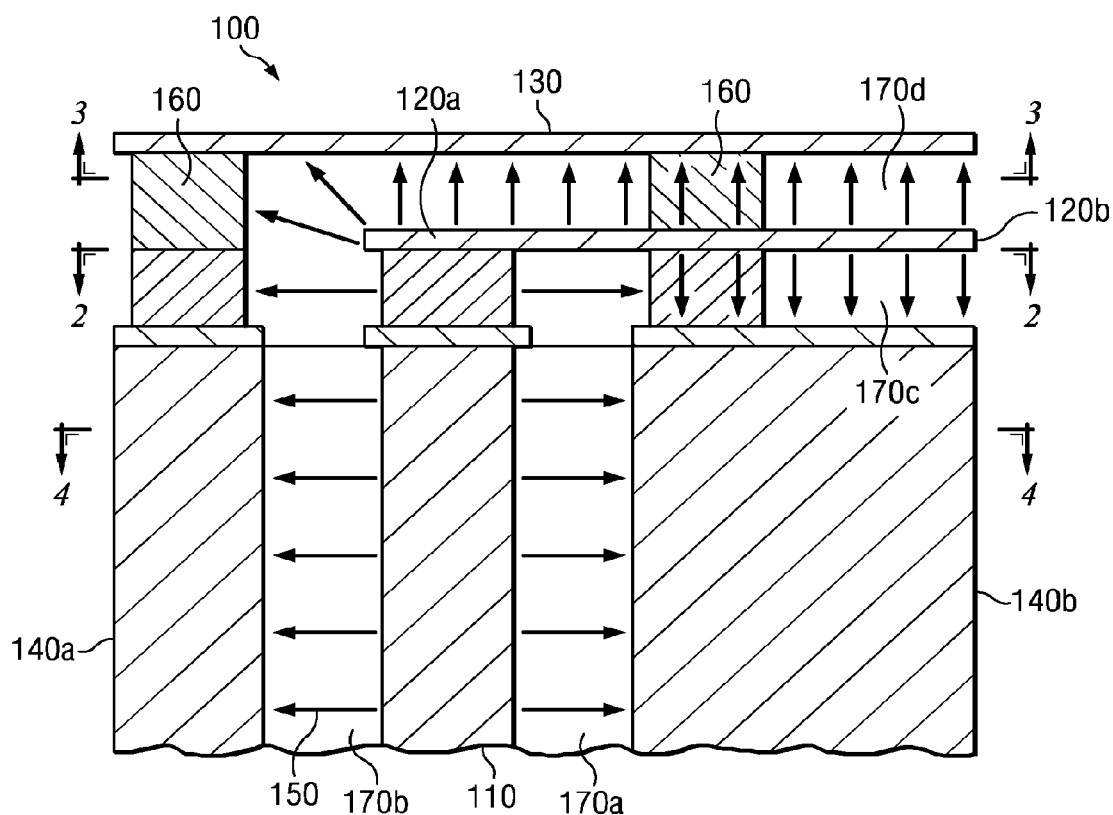
FIG. 1 is a side profile view of a radio frequency coaxial transition, in accordance with particular embodiments.

FIG. 1 is a side profile view of a radio frequency coaxial transition in accordance with particular embodiments. Radio frequency ("RF") coaxial transition 100 ("coax transition 100") allows for the propagation of RF signals to transition between a vertical path and a horizontal path. In the depicted embodiment the RF signal is propagated by electric fields 150 through coax transition 100 from the vertical direction to the horizontal direction. This may generally be referred to as the propagation path. While coax transition 100 is discussed in terms of a vertical to horizontal transition, the transition may be between any two different directions (e.g., 'North' to 'West'). Furthermore, while the illustrated transition is orthogonal other embodiments may have non-orthogonal transitions.

Coax transition 100 may be used anywhere where a change in direction of the propagation path of an RF signal or transition between a coaxial interface and a planar transmission line is desired (e.g., a microstrip transmission line). Thus, coax transition 100 may be used in a variety of tasks covering a wide range of RF frequencies. For example, in certain embodiments, such as those involving an RF or microwave circuit board, coax transition 100 may be used to transition from a surface mounted vertical coaxial launcher to a horizontal stripline transmission line coupled to the circuit board. This may allow for RF signals to be received from a surface mounted coaxial interface and communicated to another part of the circuit board. By employing coax transition 100, a better RF/microwave transition from the coaxial surface mount to the circuit board may be achieved. Furthermore, particular embodiments may allow for a vertical conductor 110 (and thus the corresponding surface mounted coaxial parts) to have a larger diameter while maintaining and/or improving on the efficiency of RF/microwave/millimeter transitions compared to a standard coax transition. The increased size may result in easier printed circuit board manufacturing.

Coax transition 100 includes a vertical conductor 110, a horizontal conductor 120, a ground plane 130, outer ground walls comprising ground walls 140a and 140b (outer ground walls 140a and 140b may collectively be referred to herein as outer ground walls 140, reference number 140 is not depicted), and via connectors 160. These components form the structure of coax transition 100, which reduces the problem of mismatched coaxial transitions. In the depicted embodiment vertical conductor 110 is a coaxial interface that is transitioning to horizontal conductor 120a, which in this example begins as a microstrip (120a) and then continues as a stripline (120b) transmission line. This transition may occur over the diameter of vertical conductor 110 while maintaining a continuous transmission line.

The components of coax transition 100 are arranged such that electric field 150 is able to pass through gaps 170 (comprising gaps 170a, 170b, 170c, and 170d (gaps 170a, 170b, 170c, and 170d may collectively be referred to herein as gaps 170, reference number 170 is not depicted) created between vertical conductor 110 and outer ground walls 140, between horizontal conductor 120-(comprising horizontal conductor 120a and 120b (horizontal conductors 120a and 120b may collectively be referred to herein as horizontal conductor 120, reference number 120 is not depicted) and ground plane 130, and between horizontal conductor 120b and ground wall 140b. Gaps 170 may comprise any desired dielectric material. Because coax transition 100 includes gap 170d between ground plane 130 and the top surface of horizontal conductor 120, there may be little or no inductive break during the transition. Also, a greater percentage of electric field 150 may be able to make the transition from a vertical propagation path to a horizontal propagation path, as compared to certain prior coax transitions in which there is no ground plane to create a gap above the horizontal conductor. A more traditional coax transition may allow a relatively large portion of the electric field to escape as it transitions from vertical to horizontal propagation paths.

In the depicted embodiment, gap 170a is substantially the same as gap 170b. This consistent gap may continue until the top surface of outer ground walls 140 is reached. At this point coax transition 100 begins to transition from a vertical direction to a horizontal direction. More specifically, the coaxial portion of coax transition 100 begins to transition to the predominantly microstrip portion (120a).

Electric field 150 on both sides of vertical conductor 110 is able to transition from the vertical propagation path to the horizontal propagation path. Furthermore, horizontal conductor 120 is able to maintain electric field 150 on both of its sides. This may be facilitated by ground plane 130. Ground plane 130 may continue for the entire length of horizontal conductor 130. This may reduce or eliminate inductive discontinuities in the propagation path of electric field 150. A traditional coax transition does not include a ground plane 130 as depicted in FIG. 1.

Figure 2:
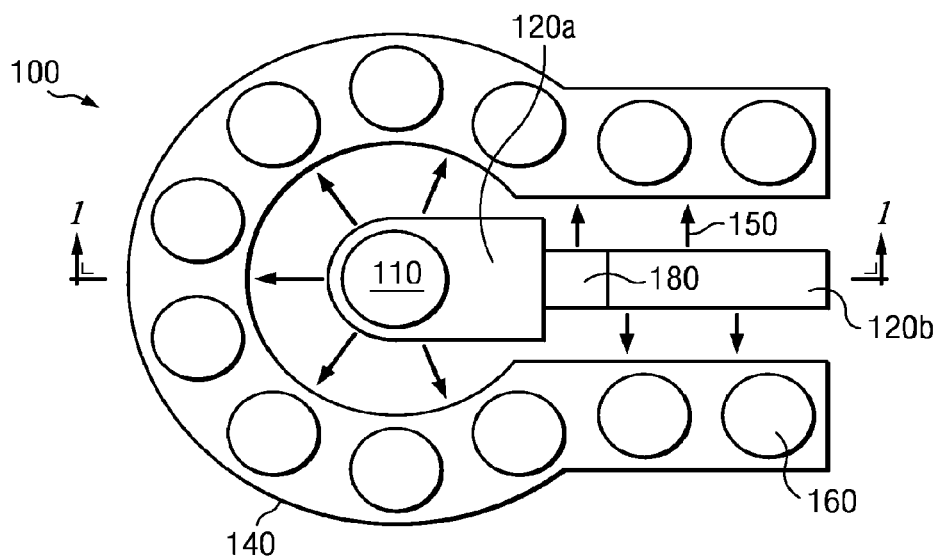
FIG. 2 is an overhead cross-sectional view of the radio frequency coaxial transition of FIG. 1 along line 2, in accordance with particular embodiments.

In FIG. 2, the overhead cross-sectional view of coax transition 100, taken along line 2 of FIG. 1, shows horizontal conductor 120, vertical conductor 110, and via connectors 160. Horizontal conductor 120 (comprising horizontal conductor 120a and 120b) is electrically connected to vertical conductor 110. This may help to facilitate transitioning the vertical propagation path of electrical fields 150 to a horizontal propagation path. While in the example embodiment horizontal conductor 120a is a microstrip conductor and horizontal conductor 120b is a stripline conductor, other embodiments may comprise any other type, or combination of types, of conductors that may be desired.

In the illustrated embodiment, horizontal conductor 120 includes quarter-wave impedance transformer 180. Quarter-wave impedance transfer 180 may aid in transitioning from the substantially cylindrical vertical conductor 110 of the coaxial interface to the substantially planar horizontal conductor 120 of the stripline transmission line.

Via connectors 160 may electrically connect the top ground plane to outer ground wall 140. In the depicted embodiment, via connectors 160 surround both vertical conductor 110 and horizontal conductor 120. Thus, both vertical conductor 110 and horizontal conductor 120 remain enclosed as coax transition 100 transitions from vertical to horizontal. This may be different than a traditional coax transition in which the horizontal conductor is not covered above by a ground plane or corresponding via connectors. The enclosure may help to preserve more of the integrity of the electric field 150 during the transition. This may result in a more efficient transition than would occur in a traditional coax transition.

Figure 3:
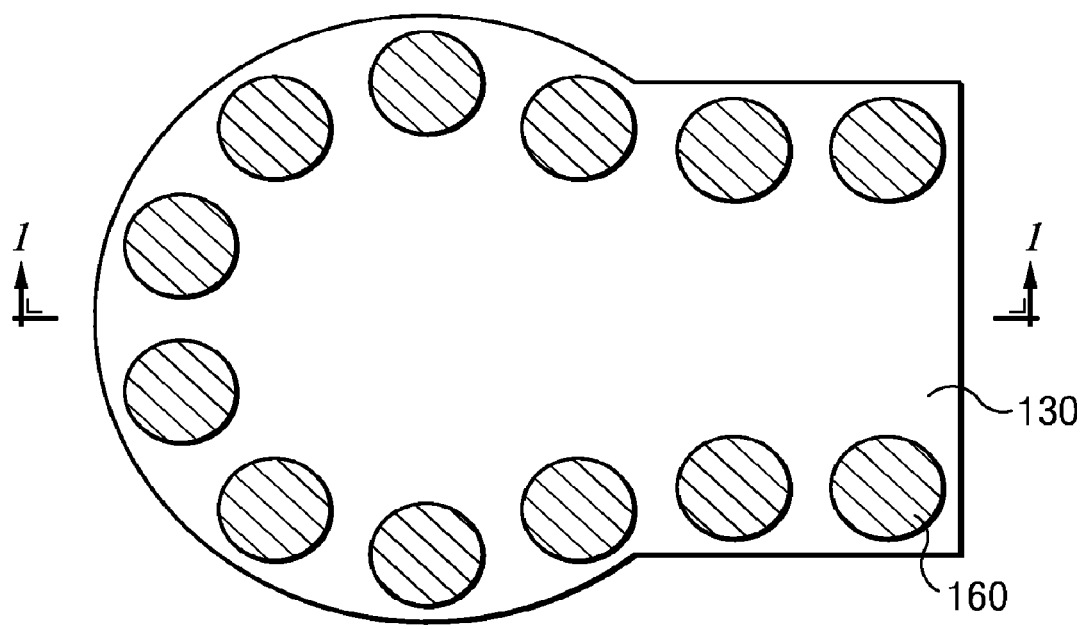
FIG. 3 is an overhead cross-sectional view of the radio frequency coaxial transition of FIG. 1 along line 3, in accordance with particular embodiments.

FIG. 3 is an overhead cross-sectional view of the radio frequency coaxial transition of FIG. 1 along line 3, in accordance with particular embodiments. From this view, the bottom surface of ground plane 130 can be seen. The shape of ground plane 130 corresponds with the shape of outer ground wall 140 (depicted in FIG. 4). Ground plane 130 may be electrically connected to the outer ground wall through via connectors 160. Thus, ground plane 130 may be at approximately the same potential as the outer ground wall. As discussed above, ground plane 130 may extend the length of the horizontal conductor which it covers. Because ground plane 130, in essence, covers the top of horizontal conductor 120 it may facilitate in providing a continuous transmission line through the transition from a coaxial interface to a microstrip transmission line. By covering the outer ground wall and the horizontal conductor, ground plane 130 may reduce the amount of RF radiation that escapes.

Figure 4:
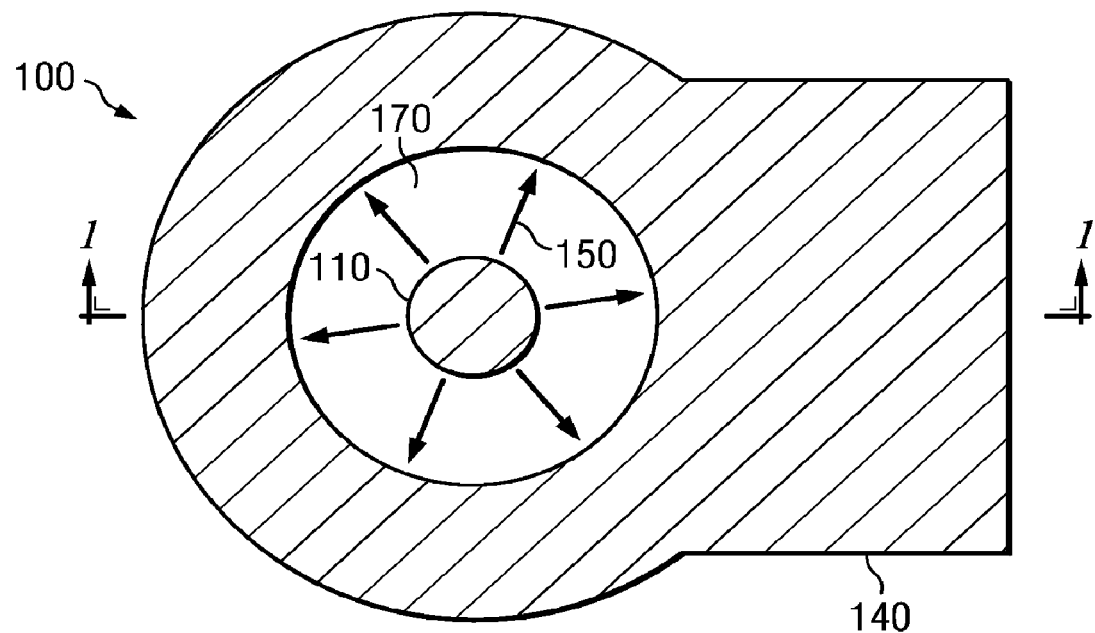
FIG. 4 is an overhead cross-sectional view of the radio frequency coaxial transition of FIG. 1 along line 4, in accordance with particular embodiments.

FIG. 4 is the overhead cross-sectional view of coax transition 100, taken along line 4 of FIG. 1. In FIG. 4 outer ground wall 140 completely surrounds vertical conductor 110. Because the depicted embodiment is a coaxial transition, vertical conductor 110 and the area enclosed by outer ground wall 140 may have axes that are substantially aligned and/or collinear. Thus, gap 170 may be of a consistent size providing a substantially constant distance between the outer surface of vertical conductor 110 and the inner surface of outer ground wall 140 for the entire circumference of vertical conductor 110. This may allow for a relatively even electric field 150 to be used to propagate the RF or microwave signals along the coaxial line. As alluded to above, vertical conductor 110 and outer ground wall 140 may form a coaxial interface for surface mounted components.

Although particular embodiments and their advantages have been described in detail, it should be understood that various changes, substitutions, and alterations can be made therein without departing from the spirit and scope the appended claims.

What is claimed is:

1. A system comprising:
    a circuit board operable to communicate a radio frequency (RF) signal between at least a first location and a second location;
    a coaxial launcher coupled to the circuit board at the first location and substantially perpendicular to a first surface of the circuit board, the coaxial launcher operable to couple a coaxial transmission line to the circuit board;
    an RF transmission line coupled to the circuit board and substantially parallel to the first surface of the circuit board, the RF transmission line electrically coupling the first location with the second location;
    a coaxial transition between, and coupled to, the coaxial launcher and the RF transmission line, the coaxial transition operable to transition a propagation path of the RF signal from a first direction substantially perpendicular to the circuit board to a second direction substantially parallel to the circuit board, wherein the coaxial transition comprises a microstrip portion comprising a substantially constant width greater than a width of the RF transmission line, the microstrip portion coupled to a center conductor of the coaxial transmission line and extending to the RF transmission line; and
    a ground plane covering the coaxial transition and the RF transmission line from the first location to the second location, wherein the ground plane is substantially parallel to the first surface of the circuit board and arranged such that there is a gap between the ground plane and an end of the center conductor of the coaxial transmission line.

2. The system of claim 1, wherein the RF signal comprises a microwave RF signal.

3. The system of claim 1, wherein the RF transmission line comprises a stripline transmission line.

4. The system of claim 1, wherein the RF transmission line comprises a microstrip transmission line.

5. A coaxial transition comprising:
a first conductor aligned along a first axis;
a ground shield surrounding the first conductor such that a first gap exists between the first conductor and the ground shield, wherein an electric field radiates between the first conductor and the ground shield through the first gap;
a second conductor aligned along a second axis and coupled to the first conductor, wherein the second conductor forms a second gap between the second conductor and a portion of the ground shield, wherein a first portion of the electric field radiates between the second conductor and the ground shield through the second gap; and
a top ground plane arranged above an end of the first conductor and aligned substantially parallel to the second conductor such that a third gap exists between the top ground plane and the second conductor, wherein the second gap and the third gap are substantially parallel with the second conductor therebetween;
wherein the second conductor comprises a microstrip portion comprising a substantially constant width greater than a width of a remaining portion of the second conductor, the microstrip portion of the second conductor coupled to the first conductor and extending from the first conductor for a distance approximately equal to the first gap.

6. The coaxial transition of claim 5, wherein the first conductor and the ground shield form a coaxial transmission line operable to communicate the electric field along the first axis.

7. The coaxial transition of claim 5, wherein the second conductor is a transmission line operable to communicate the electric field along the second axis.

8. The coaxial transition of claim 5, wherein the second axis is substantially parallel to a top surface of a circuit board.

9. The coaxial transition of claim 5, wherein the second conductor is a stripline transmission line operable to communicate the electric field along the second axis.

10. The coaxial transition of claim 5, wherein the second conductor is a microstrip transmission line operable to communicate the electric field along the second axis.

11. The coaxial transition of claim 5, wherein the second conductor comprises an impedance transformer.

12. The coaxial transition of claim 5, wherein the first and second conductors are operable to propagate a microwave RF signal.

13. A device comprising:
a circuit board;
a surface mounted coaxial launcher coupled to a first surface of the circuit board;
a radio frequency (RF) transmission line coupled to the coaxial launcher at a first location on the circuit board and extending to a second location on the circuit board, wherein the RF transmission line is substantially perpendicular to the coaxial launcher and the RF transmission line comprises a microstrip portion comprising a substantially constant width greater than a remaining portion of the RF transmission line, the microstrip portion coupled to a center conductor of a coaxial transmission line and extending a first distance along the RF transmission line wherein the first distance is approximately equal to a distance between the center conductor of the coaxial transmission line and an outer wall of the coaxial transmission line; and
a ground plane enclosing the RF transmission line from the first location to the second location, wherein the ground plane is substantially parallel to the first surface of the circuit board and arranged such that there is a gap between the ground plane and an end of the center conductor of the coaxial transmission line.

14. The device of claim 13, wherein the RF transmission line is substantially orthogonal to the coaxial launcher.

15. The device of claim 13, wherein the RF transmission line is a stripline transmission line.

16. The device of claim 13, wherein the RF transmission line is a microstrip transmission line.

17. The device of claim 13, further comprising an impedance transformer coupled to the RF transmission line.

18. The device of claim 13, wherein:
the RF transmission line extends along a second surface of the circuit board; and
the coaxial launcher comprises a coaxial RF transmission line that extends through the circuit board from the first surface to the second surface.

19. The device of claim 13, wherein the ground plane is electrically coupled to an outside wall of the coaxial launcher.

20. The device of claim 13, wherein the RF transmission line is operable to propagate a microwave RF signal.

* * * * *